United States Patent
Mouli

(10) Patent No.: US 8,686,494 B2
(45) Date of Patent: *Apr. 1, 2014

(54) RECESSED CHANNEL NEGATIVE DIFFERENTIAL RESISTANCE-BASED MEMORY CELL

(75) Inventor: Chandra Mouli, Boise, ID (US)

(73) Assignee: Micron Technology, Inc., Boise, ID (US)

(*) Notice: Subject to any disclaimer, the term of this patent is extended or adjusted under 35 U.S.C. 154(b) by 83 days.

This patent is subject to a terminal disclaimer.

(21) Appl. No.: 13/398,549

(22) Filed: Feb. 16, 2012

(65) Prior Publication Data

US 2013/0140601 A1 Jun. 6, 2013

Related U.S. Application Data

(60) Continuation of application No. 13/038,443, filed on Mar. 2, 2011, now Pat. No. 8,119,459, which is a division of application No. 12/683,939, filed on Jan. 7, 2010, now Pat. No. 7,915,673, which is a continuation of application No. 11/263,254, filed on Oct. 31, 2005, now Pat. No. 7,655,973.

(51) Int. Cl.
*H01L 29/66* (2006.01)

(52) U.S. Cl.
USPC .................................................. 257/330

(58) Field of Classification Search
USPC ............ 257/E29.211–E29.225, 68–71, 257/296–330, 905–908, E27.084–E27.097, 257/E27.075, E27.079, E29.036–E29.038, 257/E29.046–E29.048, E29.115, E29.196, 257/E21.388–E21.393, E21.614, E21.677
See application file for complete search history.

(56) References Cited

U.S. PATENT DOCUMENTS

| 4,158,238 A | 6/1979 | Erb |
| 4,247,916 A | 1/1981 | Erb |

(Continued)

FOREIGN PATENT DOCUMENTS

| TW | 565849 | 12/2003 |
| TW | 574704 | 2/2004 |

OTHER PUBLICATIONS

Wann, et al. "A Capacitorless DRAM Cell on SOI Substrate," IEDM 1993.

(Continued)

*Primary Examiner* — Dao H Nguyen
*Assistant Examiner* — Tram H Nguyen
(74) *Attorney, Agent, or Firm* — Schwegman, Lundberg & Woessner, P.A.

(57) ABSTRACT

The disclosed recessed thyristor-based memory cell comprises in one embodiment a conductive plug recessed into the bulk of the substrate, which is coupled to or comprises the enable gate of the cell. Vertically disposed around this recessed gate is a thyristor, whose anode is connected to the bit line and cathode is connected to the word line. The disclosed cell comprises no other gate, such as an access transistor, and hence is essentially a one-transistor device. As facilitated by the vertical disposition of the thyristor, the disclosed cell takes up a small amount of area on an integrated circuit when compared to a traditional DRAM cell. The disclosed cell is simple to manufacture in its various embodiments, and is easy to configure into an array of cells. Isolation underneath the cell assists in improving the data retention of the cell and extends the time needed between cell refresh.

40 Claims, 14 Drawing Sheets

(56) References Cited

U.S. PATENT DOCUMENTS

| | | | |
|---|---|---|---|
| 5,929,477 A | 7/1999 | Burns, Jr. | |
| 6,111,778 A | 8/2000 | MacDonald et al. | |
| 6,159,823 A | 12/2000 | Song et al. | |
| 6,503,790 B2 | 1/2003 | Noble et al. | |
| 6,555,878 B2 | 4/2003 | Song et al. | |
| 6,593,632 B1 | 7/2003 | Avanzino et al. | |
| 6,666,481 B1 | 12/2003 | Horch et al. | |
| 6,686,612 B1* | 2/2004 | Horch et al. | 257/133 |
| 6,790,713 B1* | 9/2004 | Horch | 438/135 |
| 6,845,034 B2* | 1/2005 | Bhattacharyya | 365/149 |
| 6,888,200 B2 | 5/2005 | Bhattacharyya | |
| 6,900,107 B2 | 5/2005 | Marsh | |
| 6,917,078 B2 | 7/2005 | Bhattacharyya | |
| 6,939,812 B2 | 9/2005 | Broekaart et al. | |
| 6,965,129 B1 | 11/2005 | Horch et al. | |
| 7,042,027 B2 | 5/2006 | Bhattacharyya | |
| 7,081,378 B2 | 7/2006 | Zheng et al. | |
| 7,176,073 B2 | 2/2007 | Bhattacharyya | |
| 7,224,002 B2 | 5/2007 | Bhattacharyya | |
| 7,326,969 B1* | 2/2008 | Horch | 257/133 |
| 7,329,953 B2 | 2/2008 | Tu | |
| 7,655,973 B2 | 2/2010 | Mauli | |
| 7,915,673 B2* | 3/2011 | Mouli | 257/330 |
| 8,119,459 B2* | 2/2012 | Mouli | 438/138 |
| 2001/0024841 A1 | 9/2001 | Noble, Jr. et al. | |
| 2002/0195665 A1* | 12/2002 | Jun et al. | 257/355 |
| 2004/0041206 A1 | 3/2004 | Bhattacharyya | |
| 2004/0041208 A1 | 3/2004 | Bhattacharyya | |
| 2004/0041212 A1 | 3/2004 | Bhattacharyya | |
| 2004/0262667 A1 | 12/2004 | Bhattacharyya | |
| 2005/0001232 A1* | 1/2005 | Bhattacharyya | 257/133 |
| 2005/0093147 A1 | 5/2005 | Tu | |
| 2005/0148118 A1 | 7/2005 | Zheng et al. | |
| 2008/0239803 A1* | 10/2008 | Cho | 365/180 |
| 2012/0252172 A1* | 10/2012 | Gossner et al. | 438/135 |

OTHER PUBLICATIONS

Inoh, et al., "FBC (Floating Body Cell) for Embedded DRAM on SOI," Symposium on VLSI Technology Digest of Technical Papers, pp. 63-64.

Munteanu, et al., "Generation—Recombination of Transient Effects in Partially Deplated SOI Transistors: Systematic Experiments and Simulations," EII Transactions on Electron Devices, vol. 45, No. 8, Aug. 1998, pp. 1678-1683.

Faynot, et al., "Compact Analytical Modeling of SOI Partially Depleted MOSFETs with LETISOI," Solid-State Electronics 45 (2001) pp. 599-605.

Mouli, et al., "Design Considerations for High Performance Avalanche Photodiode Multiplication Layers," IEEE Transaction s on Electron Devices, vol. 41, No. 5, May 1994, pp. 648-654.

Nemati, et al., "Fully Planar 0.562μm$^2$ T-RAM Cell in a 130nm SOI SMOS Logic Technology for High-Density High-Performance SRAMs," Proc. Of IEDM, 2004.

Nemati, et al., "A Novel High Density, Low Voltage SRAM Cell with a Vertical NDR Device," 1998 Symposium on VLSA Tech. Digest of Technical Papers, § 7.3 pp. 66-67.

Nemati, et al., "A Novel Thyristor-based SRAM Cell (T-RAM) for High-Speed, Low-Voltage, Giga-scale Memories," IEDM, 11.5.1, pp. 283-286.

Okhonin, et al., "A SOI Capacitor-less 1T-DRAM Concept," 2002 IEEE International SOI Conference, pp. 153-154.

Fazan, et al., "Capacitor-Less 1-Transistor DRAM," 2002 IEEE International SOI Conference, Oct. 2002.

* cited by examiner

US 8,686,494 B2

RECESSED CHANNEL NEGATIVE DIFFERENTIAL RESISTANCE-BASED MEMORY CELL

CROSS-REFERENCE TO RELATED APPLICATIONS

This is a continuation of U.S. patent application Ser. No. 13/038,443, filed Mar. 2, 2011 (allowed), which is a divisional of U.S. patent application Ser. No. 12/683,939, filed Jan. 7, 2010 (now U.S. Pat. No. 7,915,673), which is a continuation of U.S. patent application Ser. No. 11/263,254, filed Oct. 31, 2005 (now U.S. Pat. No. 7,655,973). Priority is claimed to all three of these applications, and all three are incorporated by reference in their entireties.

FIELD OF THE INVENTION

This invention relates to recessed thyristor-based memory cell design for an integrated circuit.

BACKGROUND

Many different types of memory cell designs exist in the integrated circuitry art, each with its own advantages and disadvantages. For example, a traditional dynamic random access memory (DRAM) cell comprises a capacitor for storing charge representative of a logic '0' or '1' state, and an access transistor for accessing such charge and sending it via a bit line to a sensing circuit. Such a cell design is beneficial in that it can be made relatively dense, and hence many such cells can be placed on a given integrated circuit, amounting in large amounts of memory.

That being said, traditional DRAM cells are not optimal. As just noted, such cells require two elements per cell—the capacitors and the access transistor. While many different DRAM cell designs exist with the goal of reducing the area such cells take up on the surface of an integrated circuit, the reality is that accommodating two elements per cell comprises a significant sizing issue.

In one approach to making smaller memory cells, it has been proposed to use thyristors as the storage element in a memory cell. A thyristor essentially comprises two diodes in series, or what is sometimes referred to as a PNPN structure, which reflects that the device is formed by doping of alternating polarities (P and N). As has been noted in the prior art, thyristor-based cells can be used to selectively store charge, and hence such cells are useable as memory cells. For example, charge can be stored by causing the junctions within the structure to become reversed biased, and such selective storage can be facilitated by gating the thyristor.

However, even thyristor-based memory cell designs are non optimal. Some require or use, in addition to a thyristor gate, an additional access transistor gate for selectively allowing charge transfer between the bit line and the thyristor. Such cell designs therefore suffer from the same drawback as traditional DRAM cells in that they require two devices—an access transistor, and the gated thyristor. In thyristor-based cells not having an access transistor, previous structures still generally take up inordinate amounts of area on the surface of the integrated circuit, for example, because the thyristor is built planar (i.e., horizontally) in the substrate of the integrated circuit. Moreover, such thyristor-based cells not having access transistors have been touted as replacements for traditional SRAM cells, and it is not believed that such cells have been designed as DRAM cells, which are preferable to SRAM cells in many applications. Still other thyristor designs require the device's substrate to be isolated from the bulk substrate, for example, by using a buried oxide (Box) or by using a SOI (silicon-on-insulator) substrate. Using such specialized substrates adds complexity and cost to the manufacture of the thyristor-based cell.

In short, the memory cell art would be benefited from an improved thyristor cell design similar in functionality to a DRAM cell, and such a cell design would be small, would not require additional devices such as access transistors, and would be easily and cheaply manufactured. Embodiments of such a cell design are disclosed herein.

SUMMARY

Disclosed herein is an improved recessed thyristor-based memory cell. The disclosed cell comprises in one embodiment a conductive plug recessed into the bulk of the substrate, which is coupled to or comprises the enable gate of the cell. Vertically disposed around this recessed gate is a thyristor, whose anode (source; p-type region) is connected to the bit line and cathode (drain; n-type region) is connected to the word line. Aside from the recessed enable gate, the disclosed cell comprises no other gate, such as an access transistor, and hence is essentially a one-transistor device. As a result, and as facilitated by the vertical disposition of the thyristor, the disclosed cell takes up a small amount of area on an integrated circuit when compared to a traditional DRAM cell. Moreover, the disclosed cell is simple to manufacture in its various embodiments, and is easy to configure into an array of cells. Isolation underneath the cell, while not required in all useful embodiments, assists in improving the data retention of the cell and extends the time needed between cell refresh.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 1:
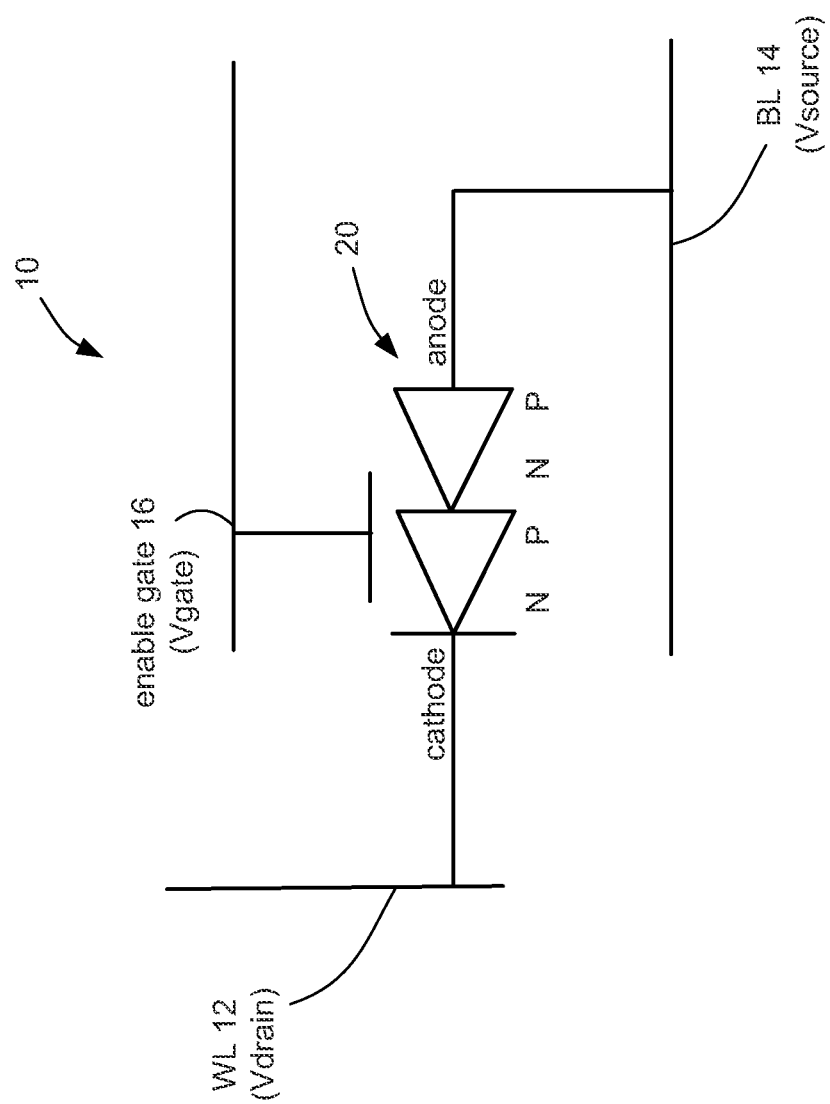
FIG. 1 illustrates a schematic of the disclosed recessed thyristor-based cell.

The improved thyristor-based memory cell 10 is shown schematically in FIG. 1. As can be seen, the cell 10 comprises a thyristor 20, which as noted earlier is a PNPN structure and hence is represented as two serially-connected diodes for ease of illustration. The anode or source of the thyristor 20 (the outer P-region) is coupled to bit line 14. The cathode or drain of the thyristor 20 (the outer N-region) is coupled to a word line 12. The thyristor 20 is gated by an enable gate 16.

Figures 8A, 8B:
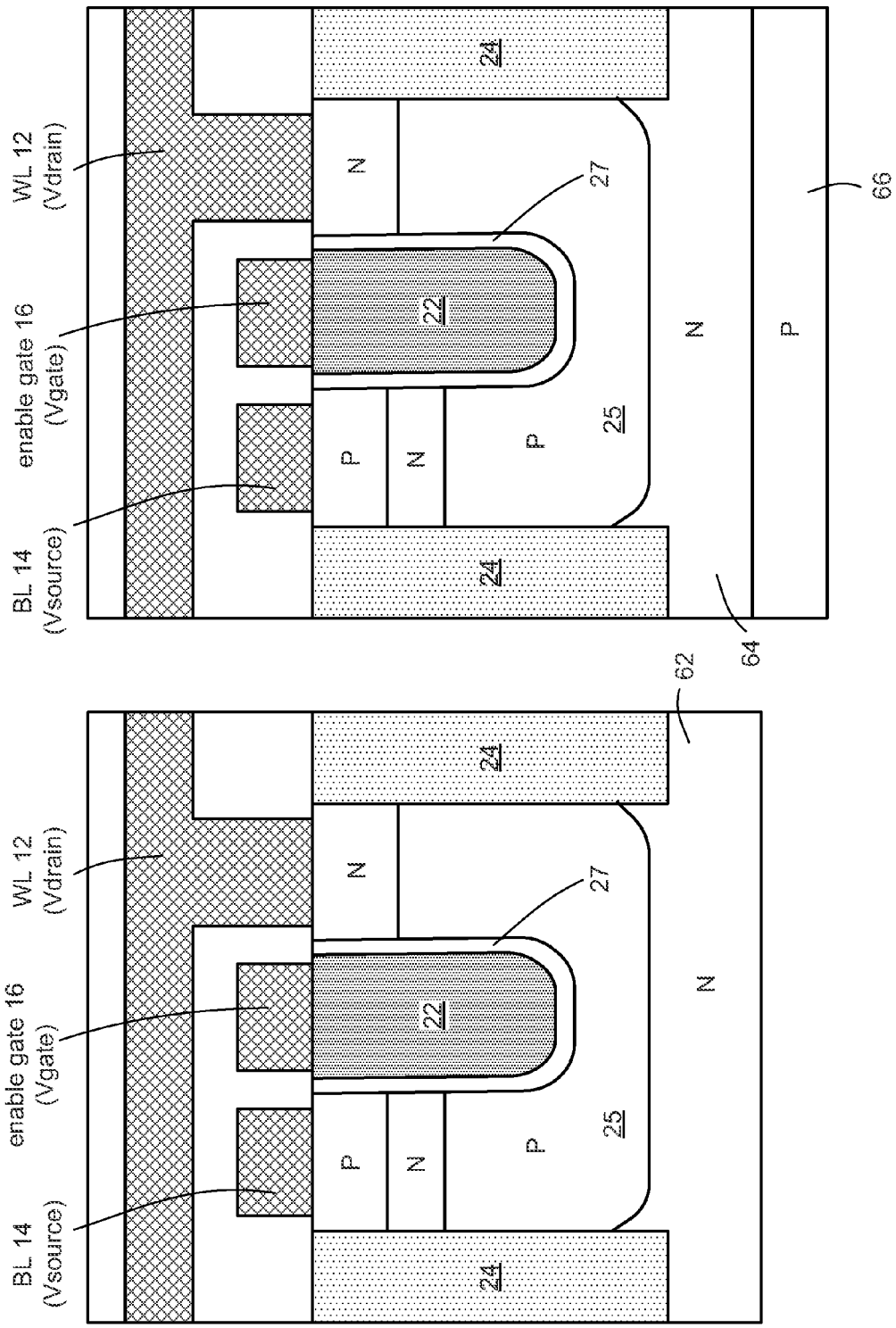
FIGS. 8A-8B illustrate an exemplary process for fabricating the disclosed recessed thyristor-based cell using junction isolation underneath the cell.

As should already be apparent from the schematic of FIG. 1, the cell 10 is simple in design. It requires only a single gate (16), and thus comprises a one-transistor cell, somewhat akin to the access transistor of a traditional DRAM cell, but without a discrete storage capacitor. Moreover, and as will be seen in subsequent Figures, the thyristor 20 portion of the cell is realizable in compact fashion in a traditional semiconductor substrate, e.g., a p-doped substrate. The cell 10 does not require substrate isolation below the cell, although, as will be discussed with reference to FIGS. 8-10, such isolation if used can further improve the performance of the cell and can increase the time needed between refreshes of the cell.

Figure 2:
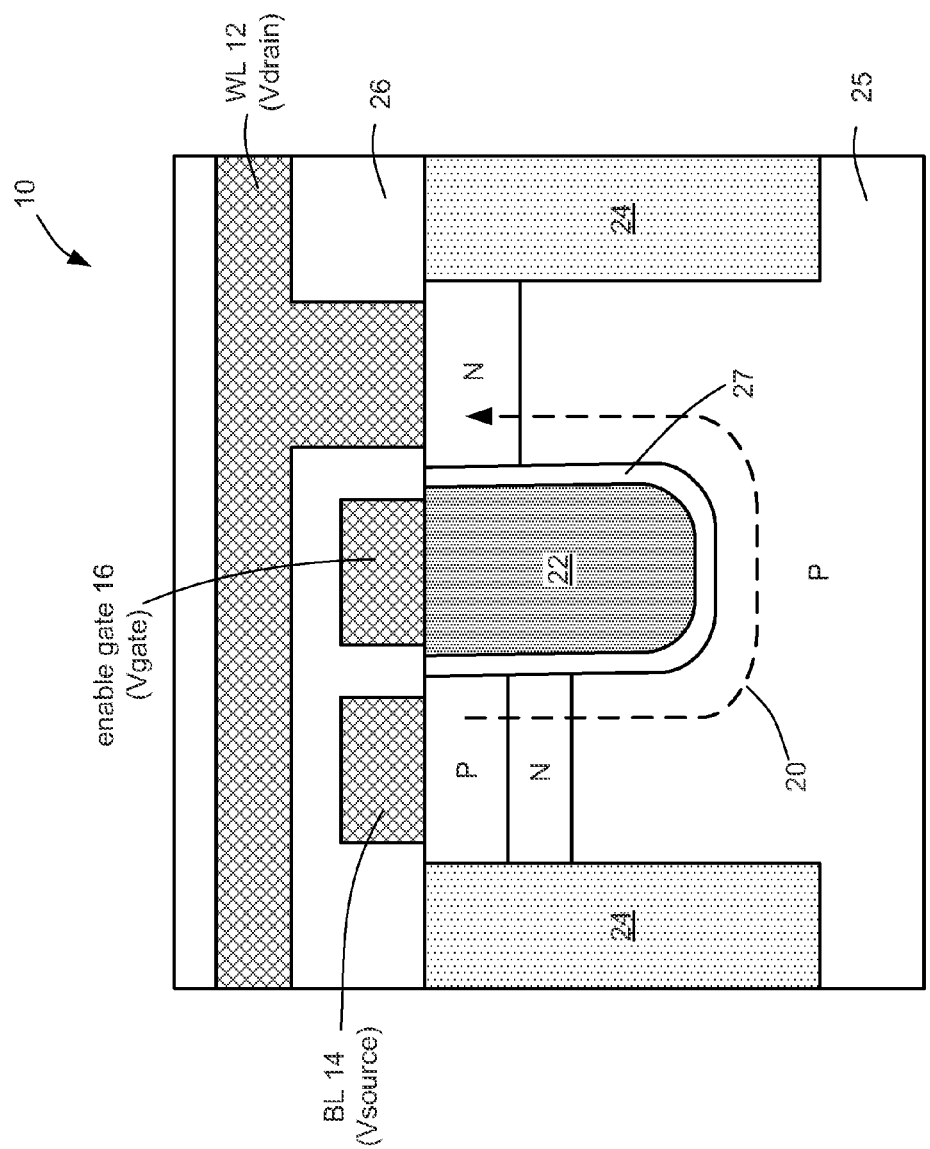
FIG. 2 illustrates an embodiment of the disclosed recessed thyristor-based cell in cross section.

The cell 10 is preferably recessed into the substrate 25, as shown in one embodiment in FIG. 2. Specifically, the enable gate 16 meets with a conductive plug 22 formed in a trench into P-substrate 25. A gate oxide 27 separates the plug 22 from the substrate 25 to allow the thyristor 20 to be gated. As can be seen at the dotted-lined arrow, the thyristor 20 is not planar, but instead is formed vertically formed around the trench in the shape of a "U." This non-planar configuration further decreases the amount of area that the cell 10 occupies on the substrate 25.

Figure 3:
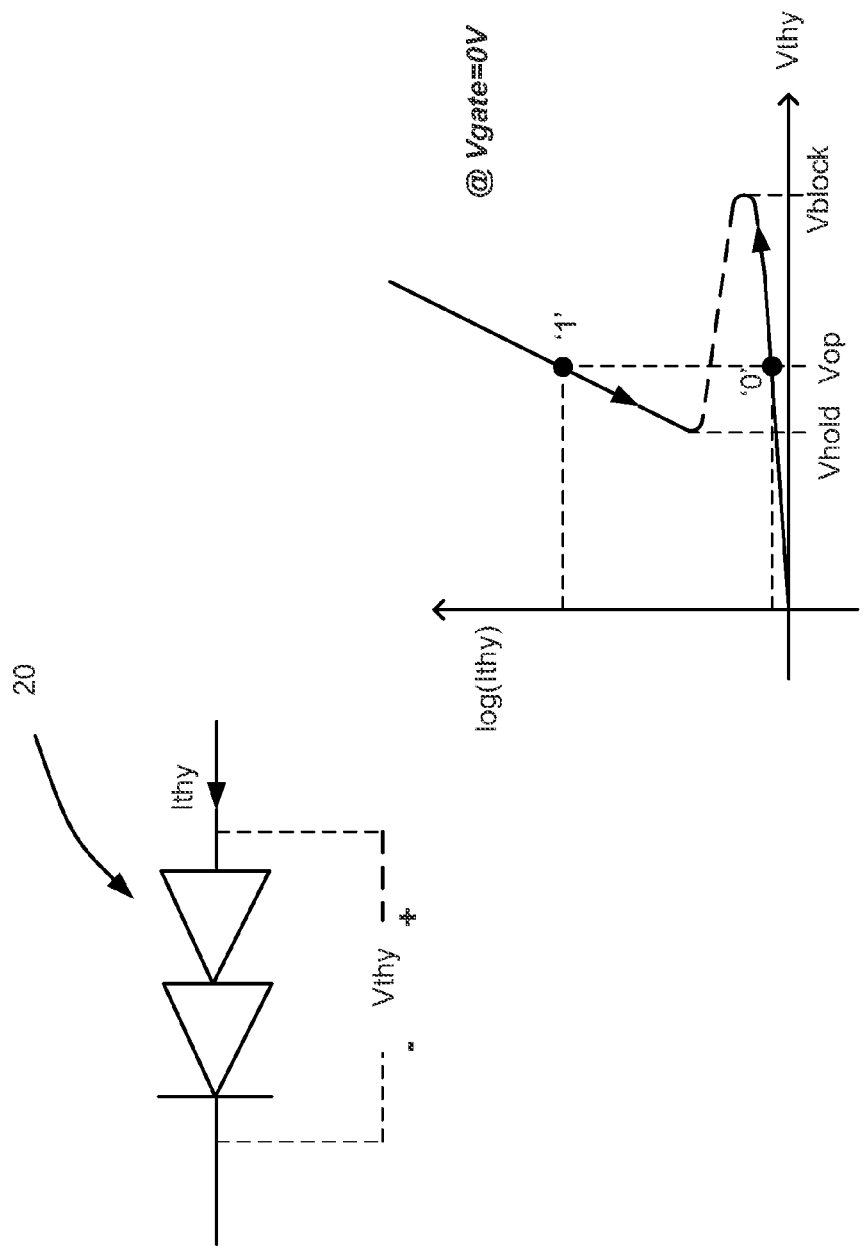
FIG. 3 illustrates the current-voltage characteristics of the thyristor in the disclosed cell.

Before discussing the various alternative forms that the recessed thyristor-based cell 10 can take, and before discussing the various ways in which the cell can be fabricated, the operation of the cell is briefly discussed with reference to FIGS. 3 through 5. FIG. 3 shows the principle upon which the thyristor-based cell 10 operates with reference to a current-voltage curve. As this principle is well known, it is only briefly discussed. As shown, when the voltage across the thyristor (Vthy) exceed a certain threshold (Vblock), minority carriers are injected into base (i.e., substrate 25) of the thyristor, and the thyristor enters a period of negative differential resistance, after which the voltage Vthy falls and the current through the thyristor (Ithy) sharply increases. Thus, when Vthy exceeds Vblock, the cell can be said to be programmed to a logic '1' state, and will draw an appreciable current. If Vthy does not exceed Vblock, then the thyristor is not triggered, and the current remains relatively low, i.e., a logic '0' state.

Once the voltages are removed from the device, the cell 10 will retain its charge for a short period of time, perhaps on the order of milliseconds. This occurs due to the depletion region that forms at the PN junctions of the cell. Thus, when programmed via charge injection, the PN junctions will, because of the stored minority-injected charge, be brought into reverse bias, accentuating the depletion regions and their capacitance. This depletion region capacitance stores the minority-injected charge, at least until these minority carrier recombine in the substrate 25. Due to such recombination effects, the thyristor, when used as a cell, may need to be refreshed not unlike a standard DRAM cell.

In any event, after such programming, an operating voltage (Vop) can be placed across the thyristor, and its current monitored to determiner whether the cell had been programmed to a logic '1' (high current) or a logic '0' (low current) state. As one skilled in the art will appreciate, this behavior of the thyristor 20, i.e., its current/voltage characteristics, is preserved even upon application of a small gate voltage (Vgate), such as enable gate 16. Of course, because a more-positive gate voltage will provide additional minority carriers in the P-substrate 25, the voltages needed to program (Vblock) and sense (Vop) will accordingly be reduced with increasing gate voltage.

Figure 4:
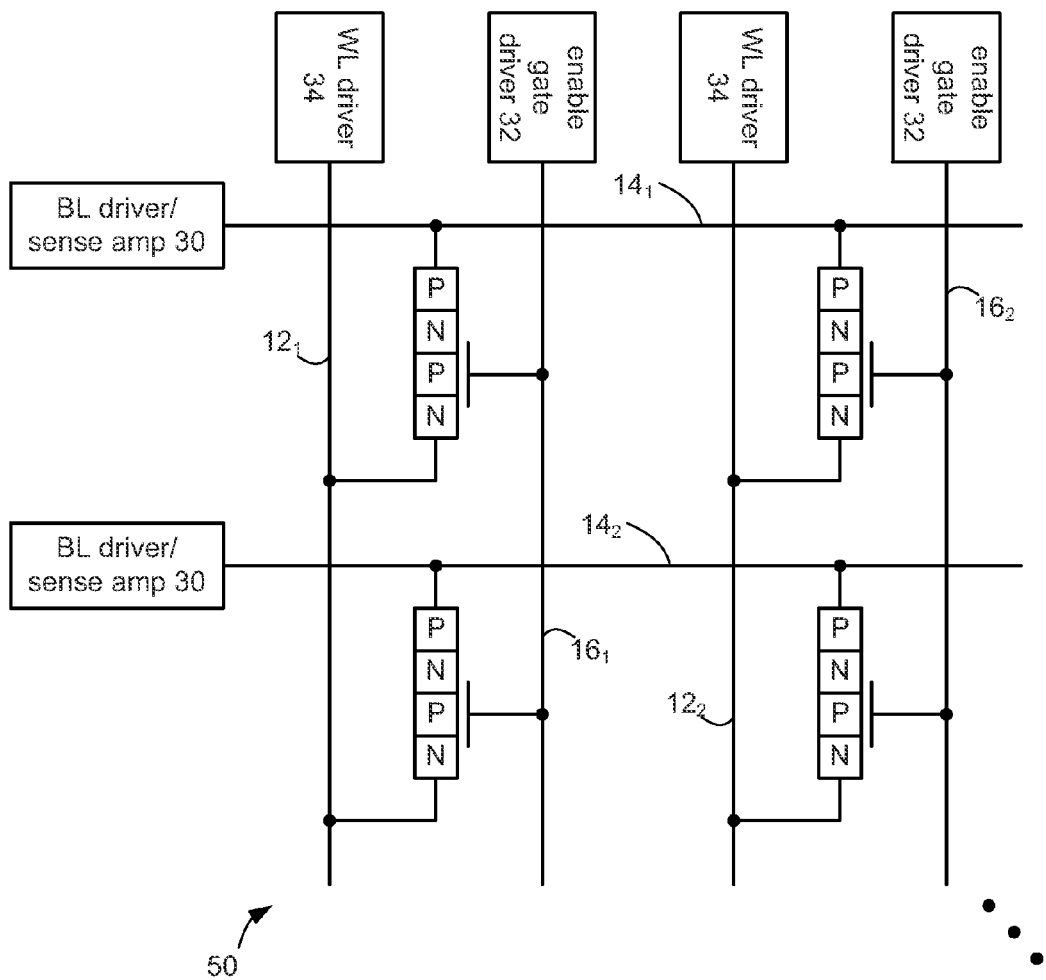
FIG. 4 illustrates an array of the disclosed recessed thyristor-based cells, including array driving and sensing circuitry.
Figure 5:
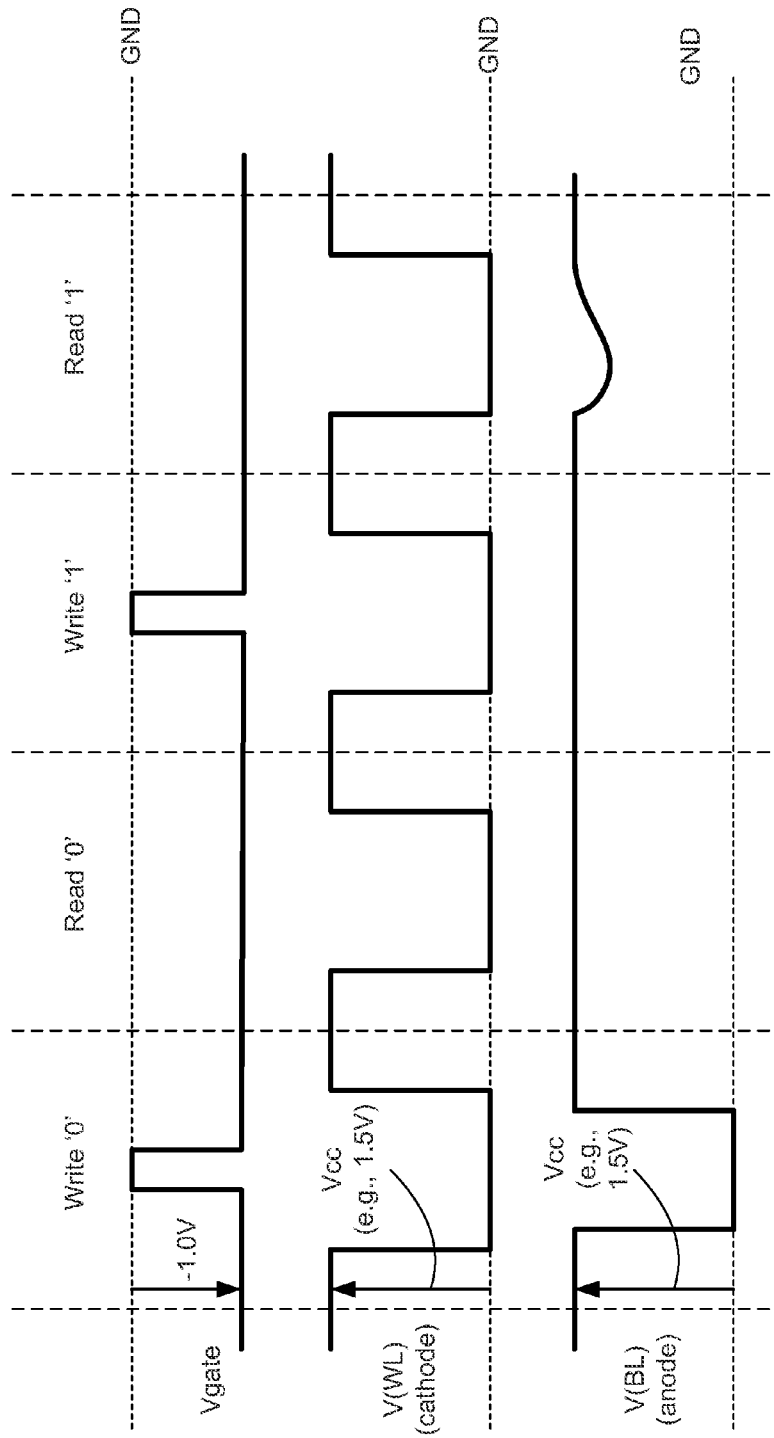
FIG. 5 illustrates exemplary voltage conditions for writing a logic '0' or '1' to the disclosed cell, for reading the disclosed cell, and for holding a voltage in the disclosed cell.

FIG. 4 shows how the disclosed cells 10 can be situated in a memory array 50, while FIG. 5 illustrates the various voltages that can be used to write a logic '1' or '0', to read the cell, and to hold data in the cell. The array 50 comprises, in one embodiment, bit lines 14 running orthogonally to the enable gates 16 and the word lines 12, but this is merely arbitrary. Additionally, at the edge of the array, and as is typical in memory devices, drivers 30, 32, and 34 are used to respectively drive desired voltages to the bit lines, enable gates, and word lines. Additionally, the bit line driver 30 comprises a sense amplifier which is active when detecting the current/voltage on an active bit line. Such driving and sensing circuits are well known in the art of memory chip design, and could comprise any number of suitable circuits.

FIG. 5 illustrates exemplary voltages that can be used to write, read, and hold the programmed data in the cells 10, and thus comprise the voltages which the drivers 30, 32, 34 will generate under control of an appropriate and typical control circuit (not shown). As can be seen, when writing to the cell, the enable gate 16 is preferably held to ground, but otherwise is held at a negative potential (e.g., −1.0V), an accumulation condition in the P-channel portion of the thyristor 20. When enable gate is grounded during writing, the P-channel region in the thyristor 20 tends towards inversion, with the possibility that Vblock may or may not be exceeded (see FIG. 3). Whether Vblock is exceeded depends on the bit line voltage at the anode relative to the grounded word line voltage on the cathode: if the bit line voltage is also grounded, Vblock is not exceeded, and a logic '0' state is written; if the bit line voltage is high, e.g., Vcc=1.5V, Vblock is exceeded, and the thyristor 20 turns on (i.e., latches) to write a logic '1' state. Once written, the logic state in the cell 10 can be read by sensing the current/voltage on the bit line 14. Reading can occur with the enable gate 16 at the negative potential (e.g., −1.0V) and with the word line grounded. A logic '0,' in which the cell was not charged, fails to perturb the bit line voltage, and as a result, the bit line sense amps will recognize the cell as a logic '0'. By contrast, when reading a logic '1,' the stored charge causes the bit line voltage to fluctuate, which the sense amps 30 detect as a logic '1.' During periods in which the cells 10 are neither written to nor read, the data in the cells can be held by holding the word lines and bit lines at Vcc (e.g., 1.5V).

Figure 6A:
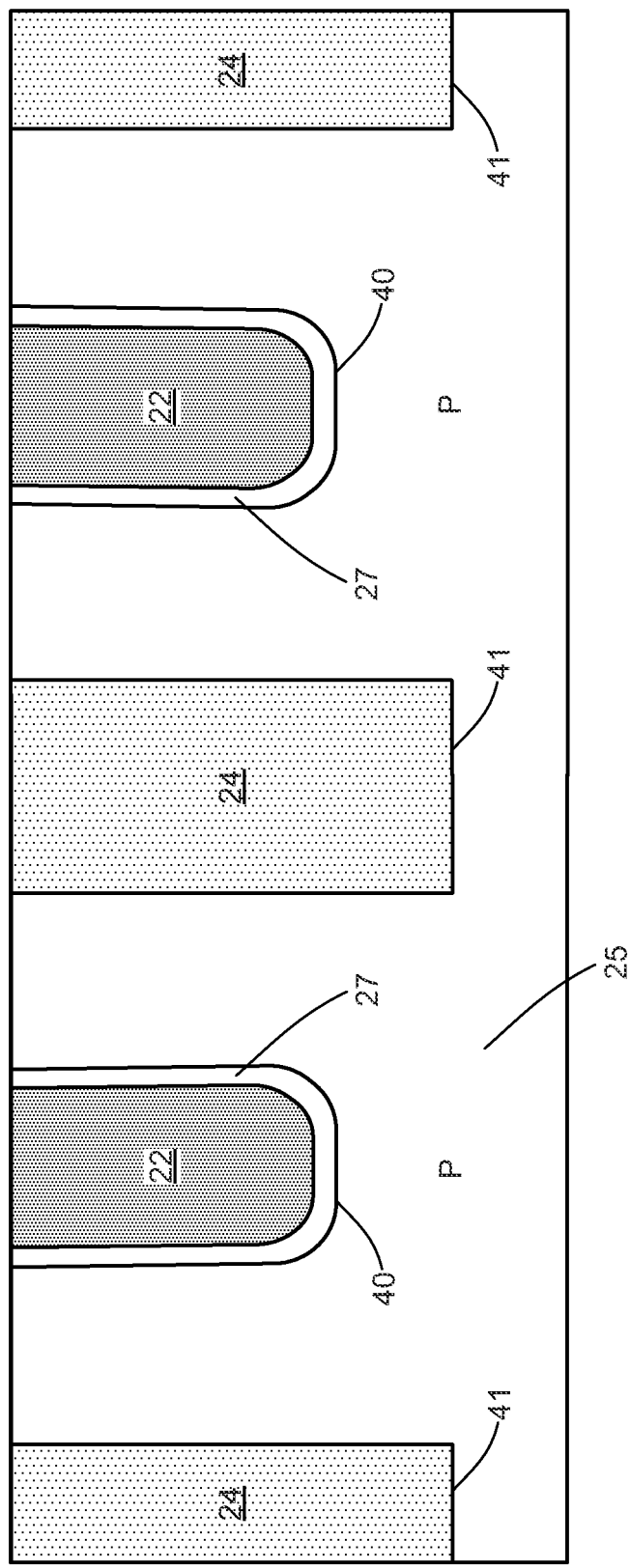
FIGS. 6A-6D illustrate an exemplary process for fabricating the disclosed recessed thyristor-based cell.

With the operation and architecture of the disclosed recessed thyristor-based cell 10 understood, attention turns to manners in which the recessed thyristor-based cells 10 can be fabricated, starting with a first embodiment shown in FIGS. 6A-6D. FIG. 6A shows two adjacent cells 10 in cross section at an intermediate stage of manufacture. At this stage, several standard processing steps have been performed, and are therefore only briefly summarized. First, a trench 40 has been etched in the P substrate 25. Following growth or deposition of a gate oxide 27, material is deposited for the conductive plug 22, which as noted above will ultimately connect to the enable gate 16. In a preferred embodiment, conductive plug 22 can comprise doped polysilicon, but could comprise other conductive materials used also for substrate plugs, such as tungsten, titanium, silicides, salicides, etc. Following deposition of the conductive plug 22 material, the surface of the substrate 25 can be planarized, such as by Chemical-Mechanical Planarization (CMP) or other known planarization techniques.

In another process step, trench isolation structures 24 are formed around each cell to prevent cross talk between adjacent cells. As is well known, the formation of trench isolation comprises forming a trench 41 in the silicon, filling the trench with a dielectric (e.g., an oxide or nitride), and planarizing the resulting structure. As one skilled in the art will appreciate, the formation of trench isolation structures 24 can also precede the formation of the recessed conductive plug 22, or can be partially concurrent with the formation of the plug, for example, by forming the plug trenches 40 and isolation trenches 41 simultaneously. In any event, the fabrication steps as so far disclosed can occur in many different manners using well known processes.

Figure 6B:
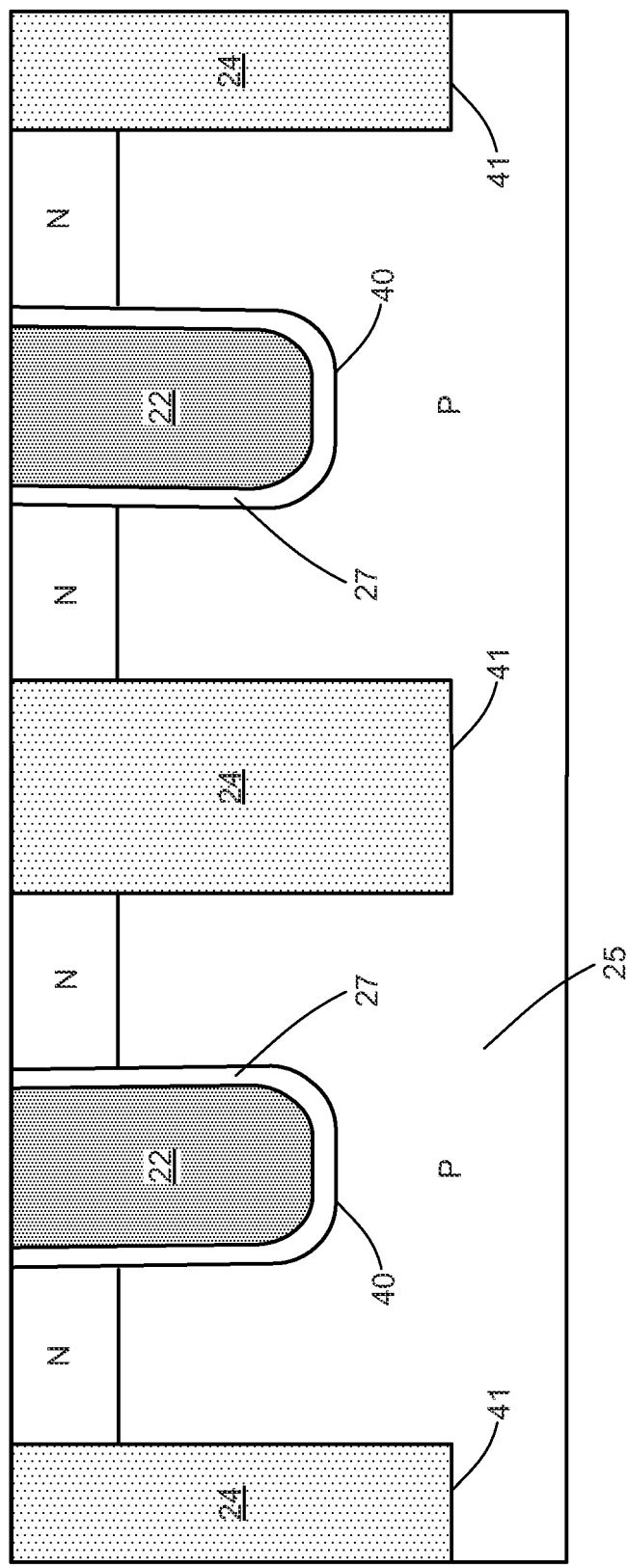

Next, and as shown in FIG. 6B, the N regions of the thyristor 20 are formed. Forming such regions can comprise a blanket ion implantation in the array of a suitable N-type dopant (e.g., phosphorous or arsenic). As one skilled in the art will appreciate, implantation into the conductive plug 22 and isolation structures 24 will not affect those structures.

Thereafter, a hard mask 43 is deposited, patterned (e.g., with photoresist; not shown), and etched to cover the cathode (i.e., bit line) portions of the thyristor 20. The hard mask 43 can comprise any material suitable as an ion implantation mask, such as nitride. Alignment of the hard mask 43 is eased by the lateral dimensions of the top of the conductive plug 22, and hence this masking step can be performed without strict tolerance.

Figure 6C:
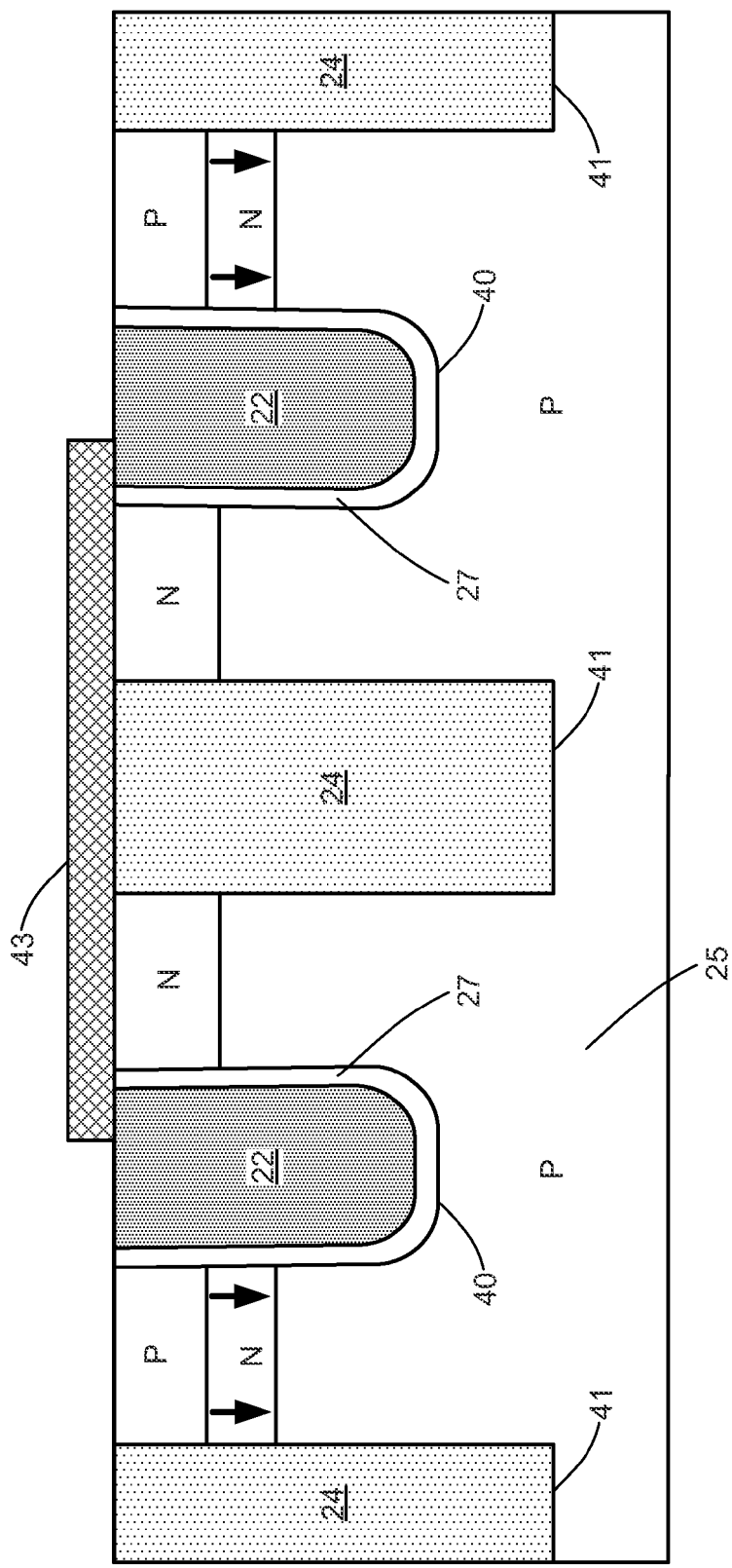

After formation of the hard mask 43, another ion implantation step is performed to form the P anodes (i.e., bit lines) of the device. As shown in FIG. 6C, after formation of the hard mask 43, the P regions can be formed using a blanket ion implantation in the array of a suitable P-type dopant (e.g., boron), with the hard mask protecting the N-regions at the cathodes. The P doping in this example occurs in a formerly doped N region. However, as illustrated by the arrows in FIG. 6C, the N regions under the newly-implanted P regions are driven downward into the substrate by the "emitter push effect," which is well known and hence not further discussed. Alternatively, if the N regions were formed deeply enough, the newly-implanted P anode region can be implanted at a shallow depth without need to rely on the emitter push effect.

Figure 6D:
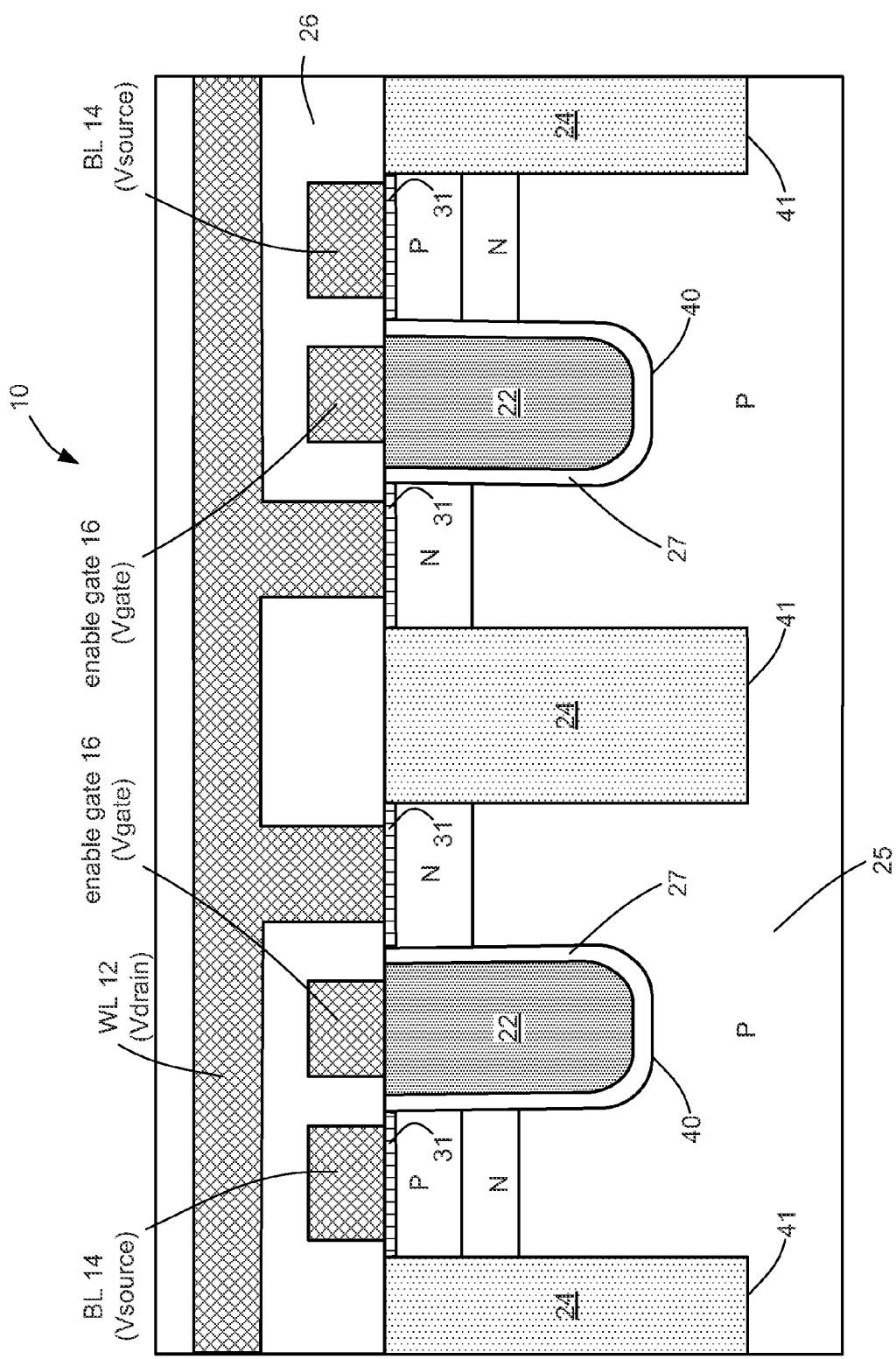

Thereafter, the hard mask 43 is removed, and standard processing can be used to form the enable gates 16, the word lines 12, and the bit lines 14 into dielectric layers 26 (e.g., oxides), as shown in FIG. 6D. However, after removing the hard mask 43, the exposed tops of the anode and cathode regions of the thyristor 20 can optionally be silicided 31, as shown in FIG. 6D. Such silicidation 31 creates a Schottky barrier, i.e., a potential barrier created at the interface between a metal silicide and a doped semiconductor region. By tailoring the silicidation process, e.g., temperature, materials, phase transformation conditions, etc., the electrical performance of this barrier can be tailored. Because the charge injected into the source and drain depends on this potential barrier, silicidation offers additional options in designing the thyristor characteristics.

Figure 7B:
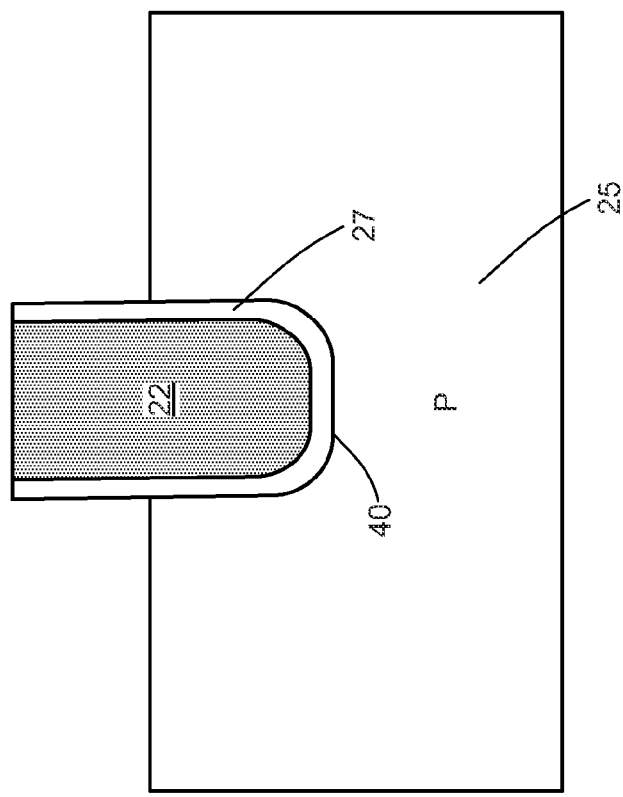
FIGS. 7A-7C illustrate an exemplary process for fabricating the disclosed recessed thyristor-based cell using epitaxially-grown silicon to form regions of the thyristor.
Figure 7A:
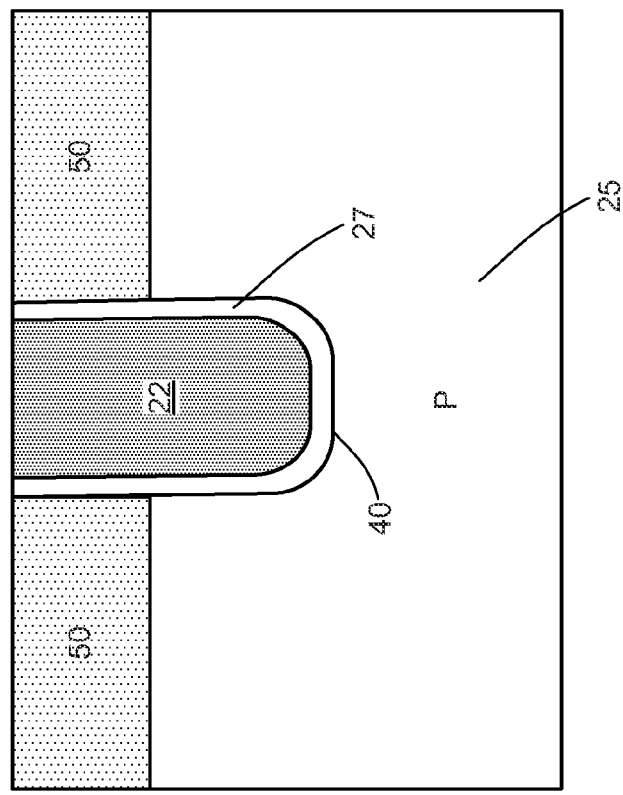
Figure 7C:
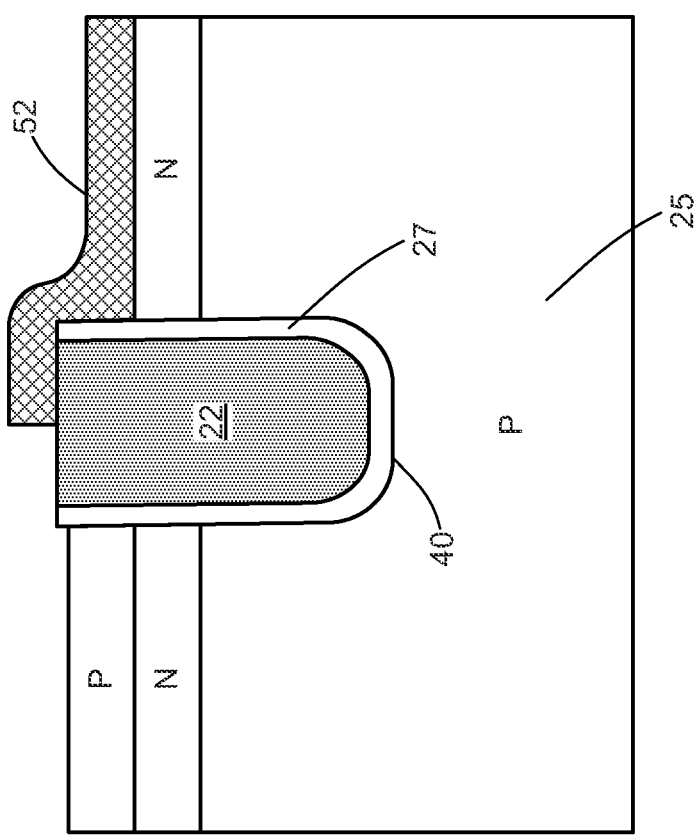

Other embodiments for the structure and manufacture of the recessed thyristor-based cell 10 are possible, and some are illustrated in subsequent Figures. First, FIGS. 7A-7C disclose a process for fabricating the recessed cell 10 in which the thyristor is formed in part using epitaxially grown silicon. Starting with FIG. 7A, a pad material 50, such as a nitride, is deposited on the surface of the substrate 25. Thereafter, a trench 40 is drilled through the pad 50 and the substrate. The trench can then be filled with gate oxide 27 and a conductive plug 22 as described earlier. Thereafter, in FIG. 7B, the pad 50 is removed. At this point, the N regions of the thyristor 20 are formed on the surface of the substrate 25, as shown in FIG. 7C. This could be accomplished by ion implantation, or the N regions could be epitaxially grown. After formation of the N regions, a hard mask 52 is formed over the cathode (i.e., bit line) portions of the thyristor 20. This allows the P anode (i.e., word line) to be epitaxially grown on the exposed N region, at which point the thyristor 20 is fully formed. After this, the hard mask 52 is removed, and processing continues to form the word lines, enable gates, and bit lines as discussed above. One skilled in the art will recognize that suitable epitaxial growth processes are well known in the art, and hence are not further discussed.

As noted earlier, isolation under the recessed thyristor-based cell 10 can improve its performance, and particularly can improve its data retention and lengthen the time needed between refreshes. Accordingly, subsequent embodiments disclose ways in which such isolation can be effectuated. For example, in FIG. 8A, the P-doped base of the thyristor (25) is formed within an N substrate 62. In this embodiment, it is preferred that the N-substrate 62 be biased to a high voltage (e.g., to the power supply voltage, Vcc) to ensure that the diode formed between the thyristor base 25 and the N substrate 62 will not be forward biased and hence will be isolated. One skilled in the art will understand that a contact to the N-substrate 62 can be used to provide the appropriate bias, although not shown in the cross section. In another embodiment, shown in FIG. 8B, a P substrate 66 is used, but isolation is formed underneath the base by forming an N well 64, and within that well 64, the P base 25 is formed. Again, the N well 64 would preferably be biased to a high voltage to provide isolation with respect to the P substrate 66 (typically grounded) and the P base 25 of the thyristor 20, although again the contact to establish such a bias is not shown.

Figure 9:
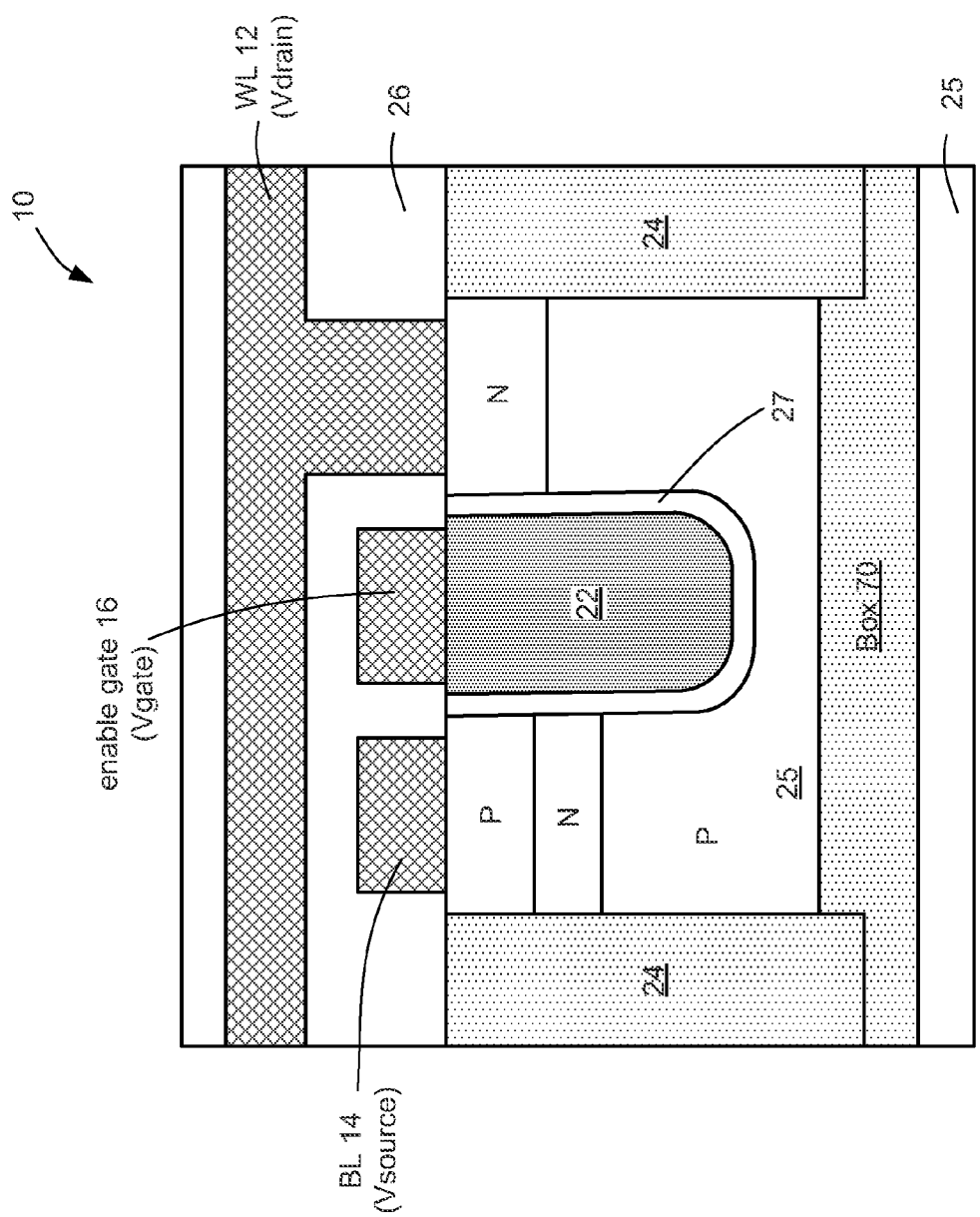
FIG. 9 illustrates an exemplary process for fabricating the disclosed recessed thyristor-based cell using a buried oxide layer or an SOI substrate underneath the cell.

Another means for improved isolation of the thyristor is shown in FIG. 9, in which the cell 10 is formed using a buried oxide layer (Box 70). Although not required, it is preferred that the Box layer 70 be rich in a P dopant, such as boron, so that P dopants from the base 25 do not diffuse to the Box layer 70 and negatively affect thyristor 20 performance. One skilled in the art will appreciate that many techniques exist in the art for forming a starting substrate 25 with a Box layer 70, and hence this is not further discussed. Additionally, it should be understood that the Box layer 70 is akin to use of the bulk insulator of an SOI (silicon on insulator) substrate, which would have similar performance to the embodiment shown in FIG. 9, and which comprises yet another embodiment of the disclosed cell.

Figure 10:
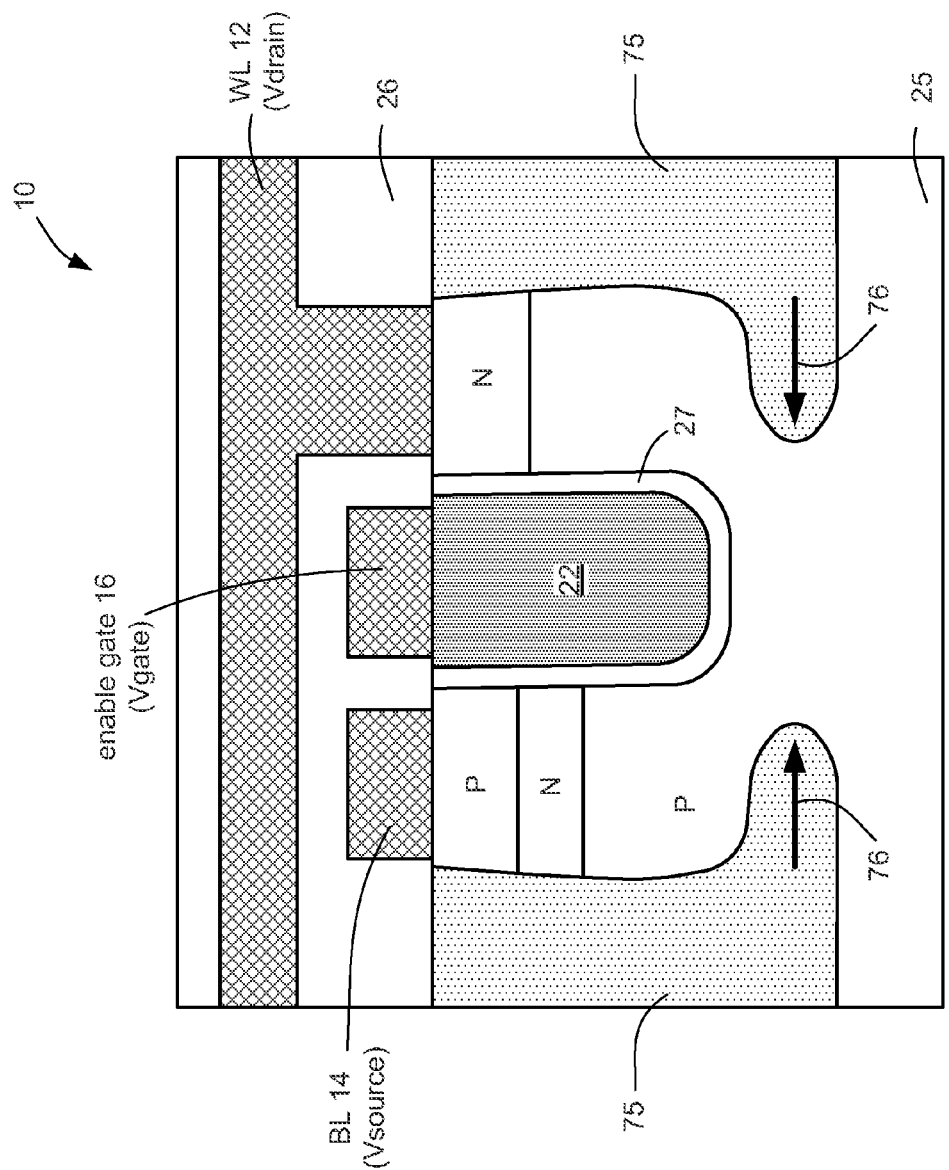
FIG. 10 illustrates an exemplary process for fabricating the disclosed recessed thyristor-based cell using isolation undercuts partially underneath the cell.

FIG. 10 illustrates another embodiment of the recessed thyristor-based cell 10 having improved isolation under the cell. In this embodiment, the isolation structures 75 include undercuts 76, which as their name suggests undercut the thyristor 20 in significant part and assists in its isolation. The undercuts 76 can be formed by first creating an anisotropic trench (e.g., trench 41 of FIG. 6A), and then subjecting the trench to a wet etch after the trench has been formed. For example, a wet etch solution of TMAH (Tetra-Methyl Ammonium Hydroxide) can be used to form the undercut 76. Thereafter, the trench and undercut 76 can be filled using a low-pressure oxide vapor deposition process, as is well known, to form the undercutting isolation structures 75 as shown in FIG. 10.

Regardless of whether isolation under the thyristor 20 is used, it should be appreciated that the recessed thyristor-based cell 10 results in a cell design that is compact, easy to manufacture, and easy to form into an array of cells. As a result, the disclosed cells can exhibit improved cell densities when compared to traditional DRAM cells. Specifically, it is believed that the disclosed cell 10 would have particular applicability in embedded DRAM applications, in which volatile cells (requiring refresh) are incorporated into otherwise standard semiconductor chips, such as microprocessors or microcontrollers. In such embedded applications, refresh can occur with greater frequency, and thus even should the disclosed cell 10 require more frequent refresh than traditional DRAM cells, this would not be expected to cause a considerable design constraint. However, it should also be noted that the disclosed cell has applicability in traditional non-embedded integrated circuits as well.

While the thyristor 20 as used in the disclosed cell 10 is disclosed as being a PNPN structure, one skilled in the art will realize that a NPNP structure could be used as well. In such a structure, electrons instead of holes will comprise the majority carriers, but the cell will work equally well assuming that the potentials presented to the cell nodes are of opposite polarity. The ability to use thyristors of differing polarities provides design flexibility, particularly when considering use of the disclosed cell 10 in an embedded application.

It should be understood that the terms "anode" and "cathode" refer merely to the end node terminals of the thyristor, and accordingly that it is irrelevant which of these terminals actually sinks or sources current. Thus, these terms should be understood as interchangeably throughout this disclosure and the claims.

It should be understood that the inventive concepts disclosed herein are capable of many modifications. To the extent such modifications fall within the scope of the appended claims and their equivalents, they are intended to be covered by this patent.

What is claimed is:

1. A device comprising an array of memory cells, wherein each memory cell comprises:
    a thyristor built into a substrate;
    an anode of the thyristor in contact with either a bit line or a word line in the array;
    a cathode of the thyristor in contact with the other of the bit line or the word line in the array; and
    an enable gate for gating the thyristor, wherein the anode and the cathode are located at a surface of the substrate.

2. The device of claim 1, wherein there is no substrate isolation below the thyristor.

3. The device of claim 1, wherein the enable gate comprises a conductive plug formed in a trench in the substrate.

4. The device of claim 3, wherein a gate oxide separates the conductive plug from the substrate.

5. The device of claim 3, wherein the thyristor is formed around the trench in the shape of a "U".

6. The device of claim 1, wherein the substrate comprises a P-substrate.

7. The device of claim 1, wherein the bit line is orthogonal to both the word line and the enable gate.

8. The device of claim 1, wherein the thyristor comprises a PNPN structure.

9. The device of claim 1, wherein the thyristor comprises a NPNP structure.

10. The device of claim 1, further comprising trench isolation formed around the thyristor.

11. The device of claim 1, wherein a top of the anode and a top of the cathode are silicided.

12. The device of claim 1, wherein the anode or the cathode or both comprises epitaxially grown silicon.

13. The device of claim 1, wherein a top surface of the anode is planar with a top surface of the cathode.

14. The device of claim 1, wherein a top surface of the anode is not planar with a top surface of the cathode.

15. The device of claim 1, further comprising isolation under the thyristor.

16. The device of claim 1, wherein the thyristor further comprises a base formed in the substrate.

17. The device of claim 16, wherein the base comprises a P-doped base and the substrate comprises an N-doped substrate.

18. The device of claim 1, wherein the thyristor further comprises a base formed within a well, wherein the well is formed in the substrate.

19. The device of claim 18, wherein the base comprises a P-doped base, the well comprises an N-doped well, and the substrate comprises a P-doped substrate.

20. The device of claim 1, wherein the thyristor further comprises a base formed over an isolation structure.

21. The device of claim 20, wherein the isolation structure comprises a buried oxide layer.

22. The device of claim 1, wherein the isolation structure comprises a reversed-biased diode.

23. The device of claim 1, wherein the isolation structure includes undercuts.

24. The device of claim 1, wherein the memory cell does not comprise an access transistor.

25. A method of forming a memory cell, comprising:
    forming a trench in a substrate doped to a first polarity;
    forming a gate oxide within the trench;
    forming a conductive material on the gate oxide and within the trench;
    after forming the conductive material, performing a first doping step to form a first region and a second region, wherein the first and second regions are doped to a second polarity;
    performing a second doping step to form a third region in the second region, wherein the third region is doped to the first polarity; and
    connecting the conductive material, the first region, and the third region to control lines for the memory cell.

26. The method of claim 25, wherein the first region is at a first side of the trench and the second region is at a second side of the trench.

27. The method of claim 25, wherein connecting the conductive material comprises connecting the conductive material to an enable gate for the memory cell.

28. The method of claim 25, wherein connecting the first region comprises connecting the first region to one of a bit line or a word line for the memory cell.

29. The method of claim 28, wherein connecting the third region comprises connecting the third region to the other of the bit line or the word line for the memory cell.

30. The method of claim 25, further comprising masking the first region before performing the second doping step.

31. The method of claim 25, further comprising planarizing the substrate before performing the first doping step.

32. The method of claim 25, wherein the conductive material comprises a conductive plug.

33. The method of claim 25, wherein the first and third regions are located at a surface of the substrate.

34. The method of claim 25, further comprising forming isolation around the first, second and third regions.

35. The method of claim 34, wherein the isolation comprises trench isolation formed in the substrate.

36. The method of claim 25, further comprising forming isolation at least partially beneath the first, second and third regions.

37. The method of claim 36, wherein the isolation comprises the bulk insulator of an SOI substrate.

38. The method of claim 36, wherein the isolation comprises a reversed-biased diode.

39. The method of claim 36, wherein the isolation comprises dielectric undercuts.

40. The method of claim 25, wherein the first region, the substrate, the second region, and the third region comprise a thyristor for storing charge in the memory cell.

\* \* \* \* \*